United States Patent [19]

Matyi et al.

[11] Patent Number: 4,914,053

[45] Date of Patent: Apr. 3, 1990

[54] HETEROEPITAXIAL SELECTIVE-AREA GROWTH THROUGH INSULATOR WINDOWS

[75] Inventors: Richard J. Matyi, Richardson; Hisashi Shichijo, Garland, both of Tex.

[73] Assignee: Texas Instruments Incorporated, Dallas, Tex.

[21] Appl. No.: 94,231

[22] Filed: Sep. 8, 1987

[51] Int. Cl.⁴ .............................................. H01L 21/20
[52] U.S. Cl. ............................... 437/90; 148/DIG. 26; 148/DIG. 48; 148/DIG. 72; 148/DIG. 154; 156/603; 156/613; 437/99; 437/132; 437/226; 437/973
[58] Field of Search ...................... 148/DIG. 3, 25, 26, 148/48, 53, 65, 71, 72, 90, 110, 135, 149, 154, 169; 156/603, 610, 612-614, 645; 357/16, 60, 15; 437/39, 44, 82, 81, 83, 89, 90, 99, 104, 107, 126, 132, 173, 226, 947, 963, 973

[56] References Cited

U.S. PATENT DOCUMENTS

| | | | |
|---|---|---|---|
| 3,549,432 | 12/1970 | Sivertsen | 437/173 |
| 4,027,323 | 5/1977 | Lorenze, Jr. et al. | 156/645 |
| 4,379,020 | 4/1983 | Glaeser et al. | 156/605 |
| 4,420,873 | 12/1983 | Leonberger et al. | 437/89 |
| 4,500,388 | 2/1985 | Ohmura et al. | 148/DIG. 26 |
| 4,551,394 | 11/1985 | Betsch et al. | 437/90 |
| 4,565,584 | 1/1986 | Tamura et al. | 156/603 |
| 4,585,493 | 4/1986 | Anthony | 437/126 |
| 4,604,161 | 8/1986 | Araghi | 156/645 |
| 4,632,712 | 12/1986 | Fan et al. | 437/105 |
| 4,657,603 | 4/1987 | Kruehler et al. | 437/973 |
| 4,660,275 | 4/1987 | Lo | 156/645 |
| 4,670,088 | 6/1987 | Tsaur et al. | 437/89 |
| 4,707,219 | 11/1987 | Chen | 156/645 |
| 4,751,193 | 6/1988 | Myrick | 156/603 |

FOREIGN PATENT DOCUMENTS 0086786 4/1987 Japan.

OTHER PUBLICATIONS

Chaud et al., "Significant Improvement in Crystalline Quality of Molecular Beam Epitaxially Brown GaAs on Si(100) by Rapid Thermal Annealing", Appl. Phys Lett. vol. 49, No. 13, 29 Sep. 1986, pp. 815-817.
Koch et al., "The Growth of GaAs on Si by Molecular Beam Epitaxy", Mat. Res. Soc. Symp. Proc. vol. 67, 1986, pp. 37-43.
Lee et al., "Ion Implantation and Annealing Properties of Molecular-Beam Epitaxy Grown GaAs-on-Si", J. Nac. Sci Technol, B5(3), May/Jan. 1987, pp. 827-830.
Choi et al., "Monolithic Integration of Si MOSFET's and GaAs MESFETs", IEDM, 1985, 1985 pp. 766-767.
Soga et al., "Selective MOCVD Growth of GaAs on Si . . . ", Jap. J. Appl. Phys., vol. 26, No. 2, Feb. 1987, pp. 252-255.
Grimaldi et al., "Epitaxial Regrowth of Thin Amorphous GaAs Layers", Appl. Phys. Lett., vol. 39, No. 1, Jul. 1981, pp. 70-72.

*Primary Examiner*—Brian E. Hearn
*Assistant Examiner*—William Bunch
*Attorney, Agent, or Firm*—Melvin Sharp; James T. Comfort; Carlton H. Hoel

[57] ABSTRACT

Preferred embodiments include growth of GaAs on insulator-masked silicon; the GaAs is single crystal over the silicon but polycrystalline over the insulator. A post=growth anneal extends the single crystal region over the insulator for distances of 2-4 μm.

8 Claims, 6 Drawing Sheets

HETEROEPITAXIAL SELECTIVE-AREA GROWTH THROUGH INSULATOR WINDOWS

CROSS-REFERENCE TO RELATED APPLICATIONS

Copending U.S. application Ser. No. 912,028, filed Sept. 26, 1986, now abandoned, discloses related subject matter. This cross-referenced application is assigned to the assignee of the present application.

BACKGROUND OF THE INVENTION

1. Field of the Invention

The present invention relates to growth of semiconductor materials and devices, and, more particularly, to masked heteroepitaxial growth such as gallium arsenide on silicon dioxide masked silicon and devices in such heterosemiconductors.

2. Description of the Related Art.

Many researchers have investigated growth of semiconductordevice quality gallium arsenide (GaAs) on silicon wafers and fabrication of active devices in the GaAs. Such devices would combine the higher mobility of carriers in GaAs with the greater mechanical strength and thermal conductivity of a silicon substrate. For example, R. Fishcer et al, GaAs/AlGaAs Heterojunction Bipolar Transistors on Si Substrates, 1985 IEDM Tech. Digest 332, report GaAs/AlGaAs heterojunction bipolar transistors grown on silicon substrates and having current gains of $\beta=13$ for a 0.2 $\mu$m thick base. Similarly, G.Turner et al, Picosecond Photodetector Fabricated in GaAs Layers Grown on Silicon and Silicon On Sapphire Substrates, 1985 IEDM Tech. Digest 468, report response times of 60 picoseconds for photoconductive detectors fabricated in GaAs on silicon. These articles also note that majority carrier devices such as MESFETs fabricated in GaAs on silicon have performance approaching that of homoepitaxial devices; and this has encouraged efforts to integrate GaAs/AlGaAs optoelectronic and high-frequency devices and silicon devices on the same wafer to utilize high-data-rate optical interconnections to reduce the number of wire interconnections. Selective recrystallization of amorphous GaAs can use the high resistivity of noncrystalline GaAs; see, for example, A.Christour et al, Formation of (100) GaAs on (100) Silicon by Laser Recrystallization, 48 Appl. Phys. Lett. 1516 (1986).

One of the principal reasons for the increasing activity in the epitaxial growth of GaAs on silicon substrates is the prospect of monolithic integration of GaAs and Si devices in the same structure. In order to achieve this goal, however, it will be necessary to develop materials growth and device processing techniques that will permit the coexistence of circuit elements with vastly different fabrication requirements. One of the most promising of these approaches is the patterned growth of GaAs onto a silicon substrate through openings in a protective mask of either silicon nitride ($Si_3N_4$) or silicon dioxide ($SiO_2$). In this scheme, the fabrication of the silicon based devices (which typically require high temperature processing) would be completed prior to the deposition of a protective oxide or nitride overlayer. Single crystal GaAs could then be grown into lithographically defined holes in the overlayer, and GaAs device fabrication would follow.

Previous work has established that epitaxial GaAs can be successfully deposited onto silicon substrates through a patterning mask; see B. Y. Tsaur et al, 41 Appl Phys. Lett. 347 (1982), P. Sheldon et al, 45 Appl. Phys. Lett. 274 (1984), Daniele et al, U.S. Pat. No. 4,587,717, and Betsch et al, U.S. Pat. No. 4,551,394. In addition, the integration of Si and GaAs device structures via this technology has been demonstrated; see H. K. Choi et al, 7 IEEE Elec. Dev. Lett 241 (1986) and H. K. Choi et al, "Heteroepitaxy on Silicon", eds. J. C. C. Fan and J. M. Poate, 67 MRS Symposia Proceedings 165 (1986).

It is now well established that the differences in lattice parameters and thermal expansion coefficients between Si and GaAs creates an extensive network of dislocations that can limit the performance of GaAs devices. This situation would be exacerbated when the GaAs is deposited through holes in a mask onto a silicon surface by molecular beam epitaxy (MBE). Due to the nonselective nature of MBE growth, the single crystal GaAs regions would be in intimate contact with the polycrystalline GaAs that would grow on the amorphousmask material. The presence of this extra defective interface would naturally be expected to serve as a source for addition crystallographic defects. Similar effects are expected with other growth methods such as metalorganic chemical vapor deposition (MOCVD).

The simplest avenue for the patterned growth of GaAs on Si would involve the epitaxial growth of the GaAs onto the original planar silicon surface. However, the final level of the GaAs surface where device fabrication occurs may be several microns above the the level of prefabricated silicon devices. This situation would naturally complicate the interconnect of the two device structures by conventional metallization schemes. The obvious alternative is the deposition of the GaAs into etched trenches in the original silicon substrate. While this scheme simplifies device processing, it would require that the GaAS occur on the bottom of an etched trench. Several studies have demonstrated the sensitivity of epitaxial GaAs to the orientation of the silicon substrate; see Y. Kajikawa et al, 18th conference on Solid State Devices and Materials (Extended Abstratcts), 125 (1986), T. Ueda et al, 25 Japan, J. Appl. Phys. L789 (1986), and J. W. Lee, in "Heteroepitaxy on Silicon", eds. J. C. C. Fan and J. M. Poate, 67 MRS Symposia Proceedings 29 (1986). Thus it would be anticipated that the growth of GaAs in an etched trench may lead to a degradation of the structural and electrical parameters of the GaAs crystal. Furthermore, the competition between growth from the trench floor and sidewall could serve as an additional source of structural defects.

SUMMARY OF THE INVENTION

The present invention provides heteroepitaxial growth of a second semiconductor on a first semiconductor which is partially covered by an insulating layer, the growth includes an anneal that extends the single crystal region of the second semiconductor from contact with the first semiconductor onto the insulating layer. Preferred embodiments include growth of GaAs on silicon masked with silicon dioxide or silicon nitride. Further, preferred embodiment devices include transistors in the single crystal second semiconductor extending over the insulator and lasers microcleaved from the single crystal extensions.

BRIEF DESCRIPTION OF THE DRAWINGS

The nonphotomicrographic drawings are schematic for clarity.

DESCRIPTION OF THE PREFERRED EMBODIMENTS

Figure 1:
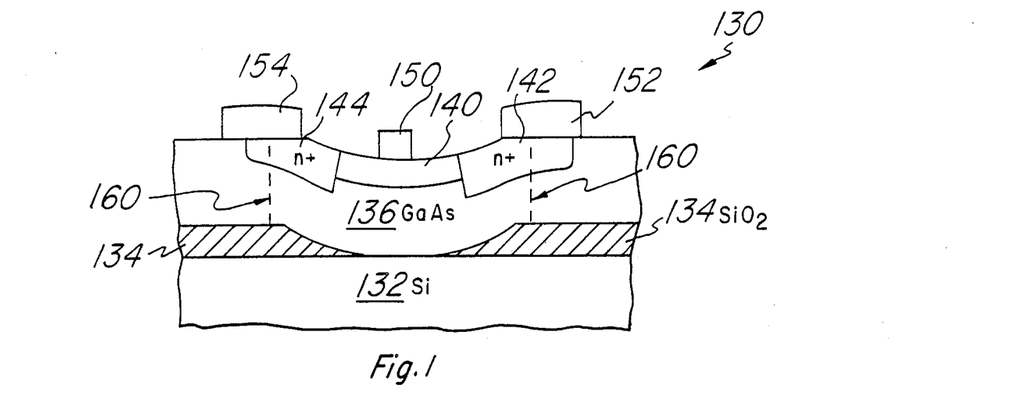
FIG. 1 is a cross sectional elevation view of a first preferred embodiment transistor.

First preferred embodiment heteroepitaxial integrated circuit transistor, shown in cross sectional elevation view in FIG. 1 and generally denoted 130, includes silicon substrate 132, silicon dioxide insulator 134, GaAs layer 136 of thickness 1.0 μm with n doped active region 140 and n+ doped source and drain regions 142 and 144, titanium/platinum gate 150, and gold/germanium/nickel ohmic source and drain contacts 152 and 154. The approximately 150 Å of GaAs layer 136 abutting silicon substrate 132 contains a regular network of misfit dislocations arising from the four percent lattice mismatch at the interface of layer 136 with silicon substrate 132, but vertically beyond this network layer 136 is single crystal GaAs. Further, layer 136 is also single crystal GaAs extending about 2 μm laterally over insulator 134 except possibly adjacent the interface of layer 136 with insulator 134; laterally beyond this single crystal region layer 136 is polycrystalline GaAs. Dotted line 170 indicates the boundary between single crystal GaAs and polycrystalline GaAs in layer 136. Note that polycrystalline GaAs has high resistivity which limits the effective lateral size of source 142 and drain 144 to the intersection of the single crystal GaAs with the n+ implanted regions of layer 135. Further, source 142 and drain 144 are located over insulator 134 which reduces the capacitance to the substrate.

Further understanding of the properties of transistor 130 may be best explained through consideration of the first preferred embodiment method of fabrication which includes the following steps:

(a) Clean undoped silicon substrate 132 of (100) orientation but tilted 3–4 degrees toward a (011) zone and deposit 0.5 μm thick silicon dioxide layer 134 by LPCVD onto a surface of substrate 132. Spin on photoresist and expose and develop a pattern 1 μm long by 10 μm wide; and isotropically etch oxide layer 134 with the patterned photoresist as the etch mask. The isotropic character of the etch undercuts the photoresist and yields tapered edges for oxide layer 134; see FIG. 2. Strip the photoresist.

Figure 2:
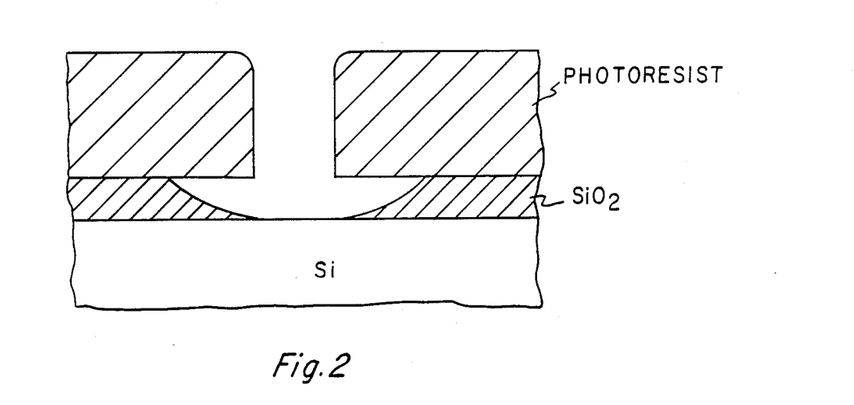
FIG. 2 illustrate a step in the first preferred embodiment method of fabrication.

(b) Insert substrate 132 with patterned oxide layer 134 into an MBE machine in a substrate holder utilizing indium-free mounting. After outgassing and oxide desorption, grow a GaAs buffer epilayer on substrate 132 (on both the exposed silicon plus the oxide layer 134) at low substrate temperature (525° C.) and low growth rate (0.4 μm/hr) to a thickness of 0.2 μm.

(c) Raise the substrate temperature to 580° C. and continue the growth of GaAs but at a rate of 0.9 μm/hr to grow epilayer 136 (not yet doped).

(d) Remove the multilayered substrate from the MBE machine and with photoresist masking implant silicon at 60 keV to dope region 140 n-type and at 180 keV to dope regions 142 and 144 n+.

(e) Insert the substrate into a quartz tube and anneal in an arsenic overpressure of one atmosphere at 850° C. for fifteen minutes. Note that the temperature is ramped up to 850° C. in six minutes. This anneal extends the single crystal portion of layer 136 over oxide layer 134 as describe infra.

(f) Lastly, deposit gate 150 and ohmic contacts 152 and 154 by standard liftoff processing. Gate 150 is 0.5 μm long and 10 μm wide and located over the 1 μm by 10 μm opening in oxide layer 134.

Prior to the oxide deposition, silicon devices could have been formed in other areas of the substrate and the GaAs removed from these areas either before or after the anneal. Then the GaAs devices could be connected to the silicon devices.

The same post-growth anneal can be performed after some more standard processing such as further patterned ion implantation. The anneal effectiveness diminishes for shorter times and lower temperatures, and longer anneals or higher temperatures can cause dopant migration and more difficult containment of the arsenic. The useful ranges for the anneal appear to be from one to twenty-four hours at lower temperatures such as 750° C. to ranges of three to five minutes at higher temperatures such as 900° C. Also, the temperature could be varied during the anneal; for example, an initial two minutes at 900° C. could be followed by ten minutes at 800° C.

The defect microstructure of GaAs grown over the edge of an oxide layer was characterized in cross section using a transmission electron microscope (TEM). Since the most critical areas are the transition regions between polycrystalline and single crystal growth, repeated steps consisting of ion milling and visual TEM inspection were required to insure that the transition region had been thinned sufficiently for TEM analysis. Double crystal x-ray rocking curves were obtained from the samples prior to the TEM analyses to examine the effect of post growth annealing on the defect density of the GaAs layer.

Figure 3:
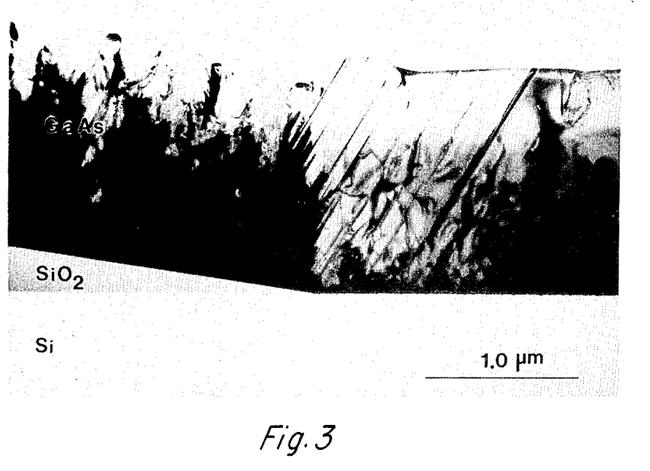
FIG. 3 is a cross-sectional TEM micrograph of the as-deposited patterned GaAs growth on the planar silicon substrate.

FIG. 3 illustrates a typical TEM cross section of the patterned GaAS that was grown epitaxially on the original (planar) silicon surface. The micrograph shows the expected presence of polycrystalline GaAs on top of the sloping sidewall of the wet etched oxide layer 134. At the transition from polycrystalline to single crystal growth a number of twins or stacking faults propagate into the single crystal region along what appear to be (111) planes. The transition itself occurs initially directly above the point at which the thickness of the oxide layer decreases to zero. The width of the transition regions itself ranges from about 0.1 μm to 0.2 μm, although a precise measure of the width is complicated by the strain contrast in the TEM micrograph.

The micrograph in FIG. 3 suggests that the defect structure of patterned GaAs on Si consists of a superposition of the intrinsic GaAs/Si defects that are generated at the heterointerface with those defects that are caused by the transition from single crystal to polycrystal growth. Far away from the oxide edge, the defect structure of the patterned GaAs appeared virtually identical to that seen in "normal" GaAs on Si. As a result, it is resonable to anticipate that devices in the central region of the patterned GaAs would exhibit performance characteristics similar to those in nonpatterned epitaxial GaAs on Si. In order to confirm this, a number of MESFETs with 1 μm gate lengths were fabricated on the patterned GaAs sample. The measured transconductances of device within the boundary of the oxide mask were typically about 250 mS/mm, thus demonstrating that reasonable GaAs devices can be achieved with patterned growth. In contrast, MESFETs fabricated on the polycrystalline GaAs outside the oxide opening showed the expected absence of transistor performance.

Figure 4:
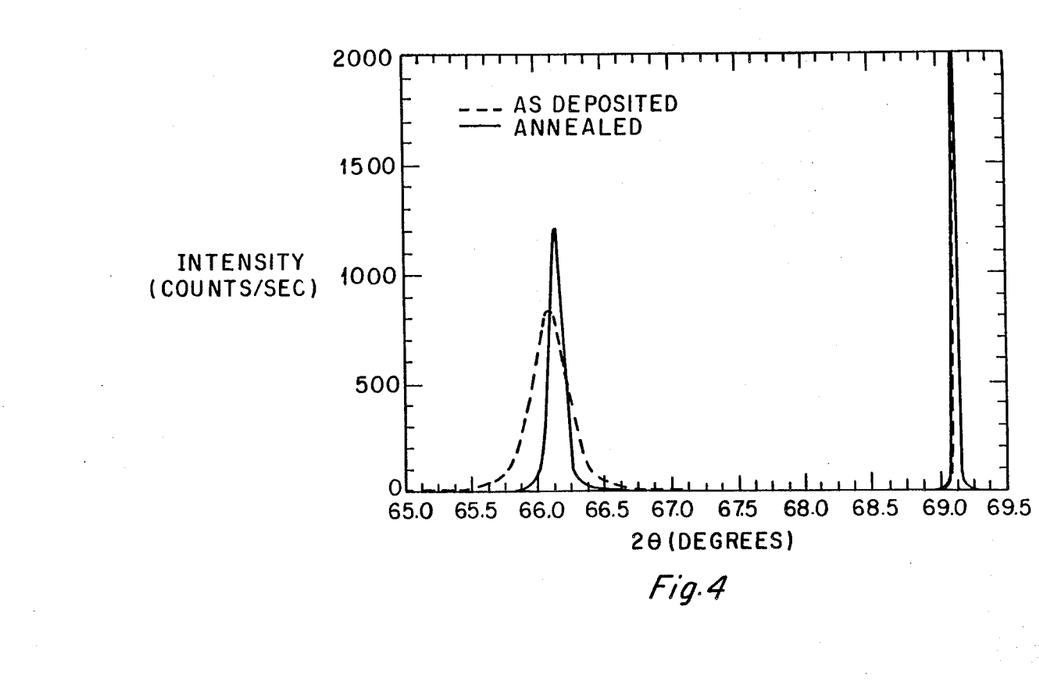
FIG. 4 is a double crystal x-ray rocking curves from as-grown and annealed patterned GaAS on silicon.

Post growth thermal annealing has been demonstrated to significantly reduce the defect density of GaAs on Si grown by MBE. Due to the increased number of defects that form at the transition region to polycrystalline in the patterned GaAs, experiments were conducted to asses the usefulness of thermal annealing in reducing the density of these defects in addition to those commonly associated with the GaAs/Si heterointerface. FIG. 4 shows double crystal x-ray rocking curves that were obtained from a patterned sample before and after a 15 minute postgrowth anneal at 850° C.; the decrease in the rocking curve width and increase in peak intensity is consistent with previous observations of annealed GaAs on Si.

Figure 5:
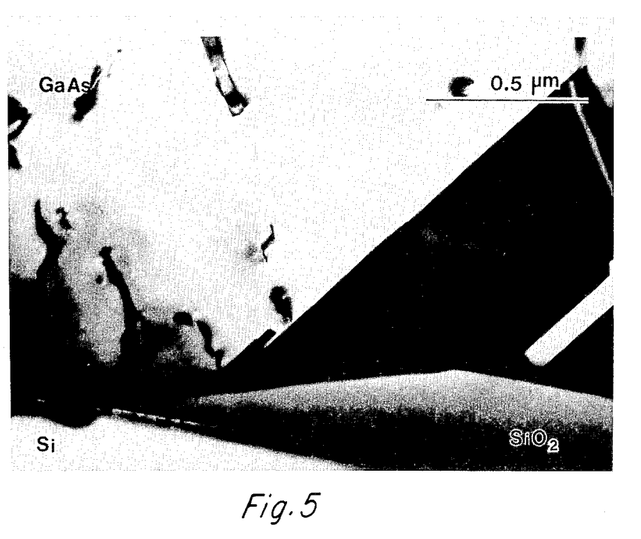
FIG. 5 is a TEM micrograph of the patterned GaAs on planar silicon following a post growth anneal.

FIG. 5 illustrates a TEM micrograph that was recorded from the annealed sample at the termination point of the oxide mask (i.e. the edge of the lithographically defined opening in the oxide layer). The figure shows that the polycrystalline GaAs that is so evident on the sloping oxide mask sidewall in FIG. 3 has been transformed into high quality crystal material. There is no evidence of the polycrystalline to single crystal transition region that was easily visible above the mask edge in the patterned GaAs prior to thermal annealing.

TEM micrographs that were recorded from transition regions in other windows in the patterning mask showed the same transformation to single crystal GaAs above the oxide sidewall. At distances greater than 2 to 4 μm from the oxide mask edge, the GaAs on top of the oxide returned to a polycrystalline structure; however, the GaAs grain size was typically much greater than that seen in the unannealed samples.

Figure 6:
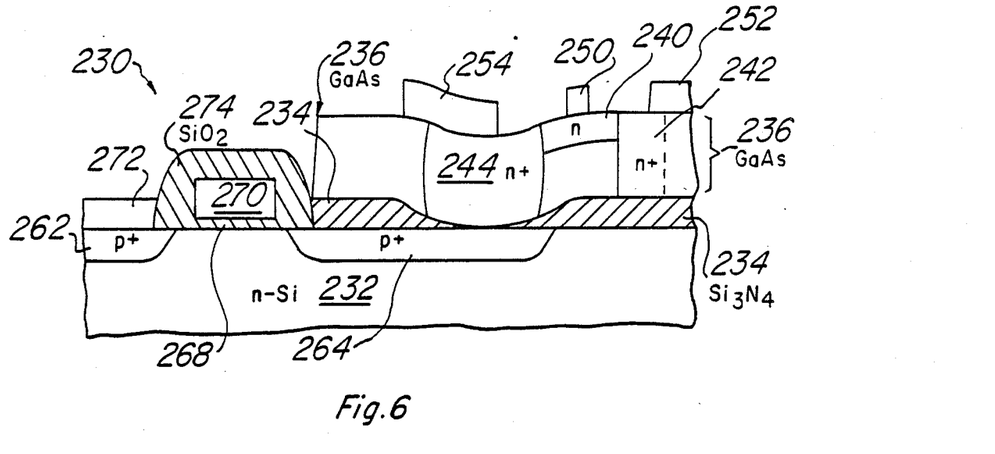
FIG. 6 is a cross sectional elevation view of a second preferred embodiment device.

Second preferred embodiment device, illustrated in cross sectional elevation view in FIG. 6 and generally denoted with reference numeral 230, includes an n channel MESFET in the GaAs layer connected to a P channel MOSFET in the silicon. More particularly, device 230 includes n⁻ silicon substrate 232, silicon nitride insulator 234 of thickness 0.2 μm, GaAs layer 236 of thickness 0.6 μm with n doped active region 240 and n+ doped source and drain regions 242 and 244, tungsten silicide gate 250, gold/germanium/nickel ohmic source and drain contacts 252 and 254, p+ source and drain regions 262 and 264 in silicon substrate 232, polysilicon gate 270 on gate oxide 268, and tungsten silicide source contact 272. GaAs layer 236 is single crystal over the silicon 232 and extending about 3 μm laterally over insulator 234 as previously described in connection with the first preferred embodiment; laterally beyond this single crystal region layer 236 is polycrystalline GaAs. Dotted line 280 indicates the boundary between single crystal GaAs and polycrystalline GaAs in layer 236. Note that the MESFET channel is located in the single crystal GaAs that is over insulator 234, and that the opening in insulator 234 provides the connection of drain 244 of the MESFET to drain 264 of the MOSFET.

The MOSFET acts as an active load for the MESFET, and with gates 250 and 270 tied together device 230 forms an inverter analogous to a CMOS inverter. Source contact 262 is positively biased relative to source contact 252 (so the p-n junction of p+ drain 234 abutting n+ drain 244 is forward biased), input signals are applied to gates 250 and 270, and output is taken off at contact 254.

Device 230 may be fabricated as follows. The MOSFET is fabricated by standard silicon processes: thermally grow gate oxide 268, deposit and pattern polysilicon gate 270, boron implant source and drain 262 and 264, and deposit and pattern interlevel oxide 274. Next the MESFET is fabricated as in the first preferred embodiment: deposit silicon nitride layer 234 and etch openings for contact to drain 264, grow GaAs layer 236 by MBE, implant silicon to form channel region 240 and source 262 and drain 244 (note that silicon ions penetrating GaAs layer 236 into silicon drain 264 will not disrupt the doping type), and anneal at 850° C. to extend the single crystal portion of GaAs. This anneal also activates the implants. Then etch away the portion of GaAs 236 and silicon nitride 234 covering the MOSFET gate 268 and source 262. Deposit ohmic contacts 252, 254, and 272 and gate 250.

Figure 7:
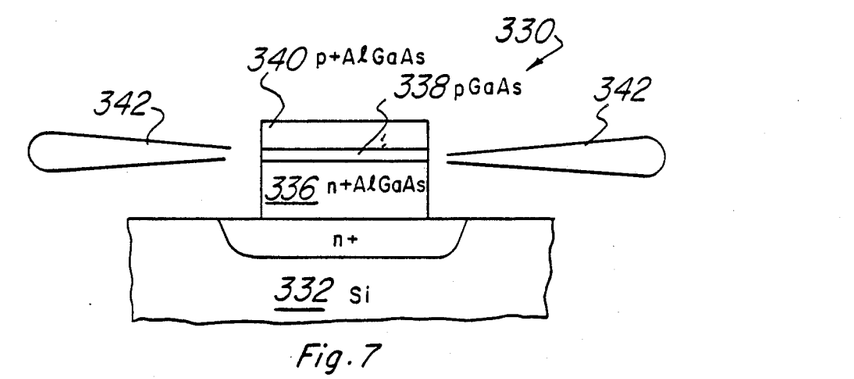
FIG. 7 is a cross sectional elevation view of a third preferred embodiment device.

Third preferred embodiment $Al_xGa_{1-x}As$ double heterojunction laser on a silicon substrate is illustrated in cross sectional elevation view in FIG. 7 and generally denoted by reference numeral 330. Laser 330 includes silicon substrate 332 with n+ contact region 334, n+ $Al_{0.3}Ga_{0.7}As$ layer 336, p doped GaAs layer 338 of thickness 0.2 μm, and p+$Al_{0.3}Ga_{0.7}As$ layer 340. An insulation layer with a stripe opening (10 μm wide by 200 μm long) for a metal contact to layer 340 and a contact to region 334 have been omitted for clarity. With sufficient dc current applied between 334 and 340, laser 330 emits coherent light as indicated by beam 342.

Figure 8:
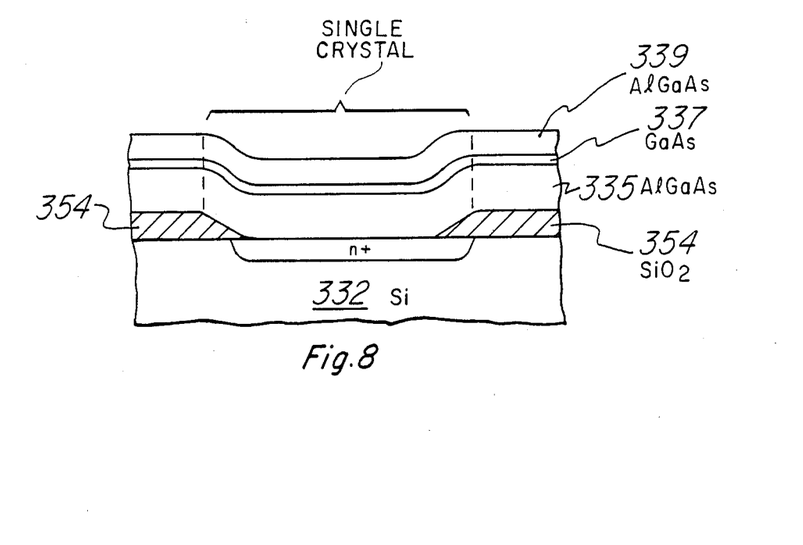
FIGS. 8–9 are cross sectional elevation views of steps in a third preferred embodiment method of fabrication.
Figure 9:
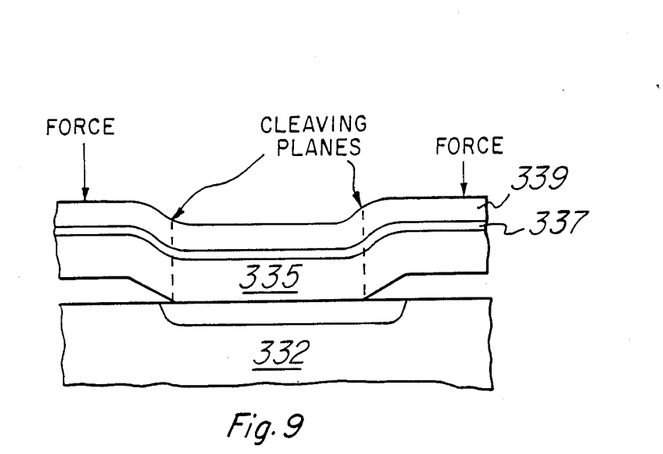

Laser 330 is fabricated by a third preferred embodiment method including microcleaving as follows. Implant arsenic into silicon substrate 332 to form n+ region 334, and deposit silicon dioxide layer 354 of thickness 0.5 μm on substrate 332 by decomposition of TEOS. Next, spin on and pattern photoresist to define the location for layer 336 (200 μm long and 100 μm wide), and etch oxide 354 with the photoresist as etch mask to form an opening with sloping sidewalls at the location for layer 336. Analogous to the first preferred embodiment method, grow by MBE an n+ in situ doped layer 335 of $Al_{0.3}Ga_{0.7}As$ of 3 μm thickness, a p in situ doped layer 337 of GaAs of 0.2 μm thickness, and a p+ in situ doped layer 339 of $Al_{0.3}Ga_{0.7}As$ of 1 μm thickness. Then anneal at 850° C. to extend the single crystal portion of layers 335, 337, and 339 laterally over oxide 354 as illustrated by the dotted lines in FIG. 8. Next, etch layers 335, 337, and 339 to define a 100 μm wide and 200 μm length plus 50 μm extra length at each end extending onto the sloped sidewall oxide 354. Then etch away oxide layer 354 which leaves the 50 μm extensions cantilevered at each end; see FIG. 9 Microcleave the cantilevered extensions (force applied along arrows in FIG. 9) to form the end mirrors of laser 330. The extensions cleave along the vertical crystal planes intersecting the former edges of oxide layer 354, thus these planes are in the region of single crystal material due to the annealing which extended the single crystal region laterally and thus provide high quality mirrors. This completes laser 330 as shown in FIG. 7.

Figure 10:
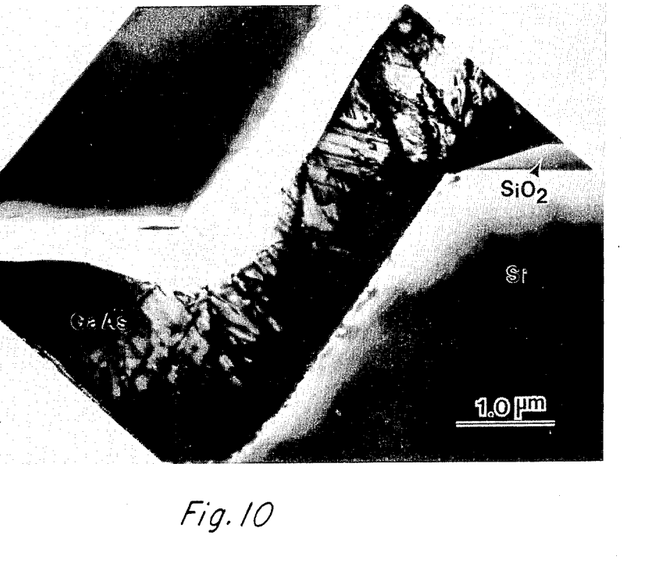
FIG. 10 is a TEM micrograph from the patterned GaAS grown in an etched silicon trench.

As is apparent with the first preferred embodiment, the patterned growth of GaAs through an insulating mask onto the original silicon substrate surface would produce a step between the silicon and GaAs single crystal surfaces that is equal to the total GaAs thickness, thus complicating subsequent device processing (e.g. metallization). A solution to this problem is the growth of the GaAS in a trench etched in the silicon surface; by adjusting the thickness of the single crystal GaAs to match the trench depth, a planar device geometry is achievable. FIG. 10 shows a cross sectional TEM micrograph that was obtained from an as-grown GaAs on silicon in which the silicon surface was etched about 2.5 μm through an oxide patterning mask prior to MBE growth. The total growth time of the GaAs was sufficient in this particular sample to produce a layer only 1.7 μm thick. The defect density in the GaAs that grew from the trench floor appears to be higher than that which was typically observed following growth from the unetched silicon surface. This increase in defect density probably arose from the nonplanar surface morpology that is likely to accompany the trench etching.

The micrograph in FIG. 10 shows that a highly defective GaAs layer grew on the sloping sidewall of the silicon trench. It is well established that the growth of high quality GaAs on silicon is highly dependent on the orientation of the silicon substrate, so it is not surprising that the growth on the trench sidewall with no orientation control would lead to the formation of an extensive array of defects. It is interesting to note that there is an apparent demarcation line between the single crystal GaAs grown from the trench floor and the defective GaAs on the sidewall. In contrast with the sample in which the silicon substrate was not etched, there is no obvious transition to the polycrystalline GaAs grown on the oxide mask.

Despite the somewhat poorer crystal in the patterned GaAS grown in the silicon trench, acceptable device performace has been achived from devices with this material. The I-V characteristics of a fully implanted enhancement mode MESFET that was fabricated from a portion of the same patterned GaAS sample shown in FIG. 10 (GaAs thickness of 1.7 μm) showed a transconductance of 140 mS/mm for a 2 μm gate length. Although the transconductance of this device was somewhat lower than desired it should be noted that the thickness of the GaAs layer was less than two microns.

Figure 11:
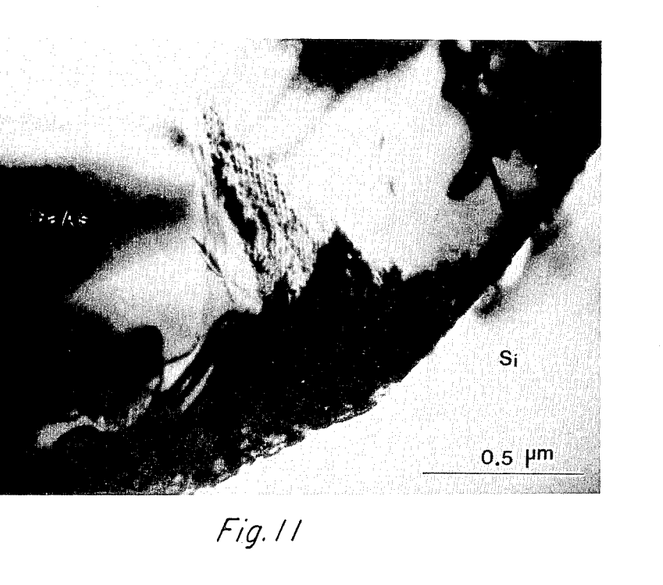
FIG. 11 is a TEM micrograph of the patterned GaAs grown in a silicon trench following a post growth anneal.

The effect of post growth annealing on the defect structure of the patterned GaAs grown in etched silicon trenches is shown in FIG. 11 (the trench floor is on the righthand portion of the figure). As was the case with the patterned growth on the unetched silicon substrate, the thermal annealing was found to produce a dramatic effect on the nature and magnitude of the defect structure in this heteroepitaxial material. Following the post growth anneal, for instance, the defect density in the GaAs that was grown from the tench floor exhibited a very significant decrease in the number of microtwins and stacking faults. A Moire pattern is visible at this interface, presumably due to the non-parallel orientation of the GaAs/Si interface with respect to the incident electron beam.

The effect of post growth annealing on the defect structure of the GaAs grown on the trench sidewall is even more surprising. While the as-grown sidewall GaAs exhibited an approxiately uniform distribution of strucural defects, the post growth anneal compresses the defects into a band along the GaÄs/Si interface. The thickness of this band is approximately 300 nm to 500 nm in width. Despite the obvious density of the defects in this sidewall interfacial region, the remainder of the GaAs in this part of the silicon trench is remarkably defect free. In fact, the density of the residual defects in the sidewall GaAs is significantly lower than that which is visible in the GaAs grown from the trench floor.

The transition from sidewall to trench floor GaAs growth shows an unusual feature in the thermally annealed sample. A triangular region containing Moire fringes is clearly evident; this feature is consistent with the presence of a grain boundary that is angled with respect to the incident beam in the TEM. The presence of this feature suggests that the sidewall and trench floor GaAs in this annealed sample consist of crystals that have different orientations. In order to confirm this, electron diffraction patterns were recorded from the two GaAS regions. The diffraction patterns showed that the GaAs on the trench floor maintained the same orientation as the silicon substrate, with the $<110>$ direction parallel to the electron beam and the $<001>$ perpendicular to the interface. In contrast, the sidewall GaAs had the $<311>$ parallel to the incident beam and a $<114>$ surface normal. It is presumed that the lack of coincidence of the silicon sidewall with a low index crystallographic direction is the origin of this unusual GaAs orientation.

Devices analogous to the first, second (GaAs portion),and third preferred embodiments could be fabricated on the floor of the trench and thus integrated in the same plane as silicon devices fabricated outside of the trench.

MODIFICATIONS AND ADVANTAGES

Various modifications of the preferred embodiment devices and methods may be made while retaining the feature of annealed III-V semiconductor material converted from polycrystalline over an insulating mask on silicon to single crystal as an extension of the single crystal material over the silicon. For example, other semiconductor materials such as III-VI semiconductors may also be used although the annealing times and temperatures may be drastically different, other insulators may be used such as oxide/nitride stacks or tantalum oxide, other substrates such as silicon-on-insulator may be used, the dimensions and shapes of the transistors and lasers could be varied, extra material layers included such as GaAS bottom and top for the laser for better contacts, (heterojunction) bipolar transistors could be fabricated in the single crystal material over the insulator, and combinations of the foregoing could be integrated on a single chip together with standard silicon devices.

The invention provides the advantages of extended single crystal heteroepitaxy material over an insulator.

What is claimed is:

1. A method of heteroepitaxy, comprising the steps of:
   (a) providing a substrate with a surface layer of a first semiconductor material;
   (b) providing an insulating mask on said surface layer;
   (c) growing a second layer of a second semiconductor material on said mask and unmasked portions of said surface layer, said growth characterized by single crystal regions on unmasked portions and polycrystalline or amorphous regions on said mask;
   (d) annealing, said anneal characterized by said single crystal regions extending laterally over said mask.

2. The method claim 1, wherein:
   (a) said first semiconductor material is silicon;
   (b) said mask is made of one of the group consisting of silicon dioxide, silicon nitride, and combinations thereof; and
   (c) said second semiconductor material is $Al_xGa_{1-x}As$ for $0 \leq x \leq 1.0$.

3. The method of claim 2, wherein:
   (a) said anneal is at a temperature between 750° C. and 900° C.

4. The method of claim 3, wherein:
   (a) said anneal is at approximately 850° C. for approximately fifteen minutes.

5. A method of microcleaving, comprising the steps of:
   (a) providing a substrate with a surface layer of a first semiconductor material;
   (b) providing an insulating masking on said surface layer;
   (c) growing a second layer of a second semiconductor material on said mask and unmasked portions of said surface layer, said growth characterized by single crystal regions on unmasked portions and polycrystalline or amorphous regions on said mask;
   (d) annealing, said anneal characterized by said single crystal regions extending laterally over said mask;
   (e) removing the portion of said sensor layer away from said exposed portions and said mask; and
   (f) applying force to portions of said second layer over areas where said mask was removed, said force characterized by intensity to cleave said second layer.

6. The method claim 5, wherein:
   (a) said first semiconductor material is silicon;
   (b) said mask is made of one of the group consisting of silicon dioxide, silicon nitride, and combination thereof; and
   (c) said second semiconductor material is $Al_xGa_{1-x}As$ for $0 \leq x \leq 1.0$.

7. The method of claim 6, wherein:
   (a) said anneal is at a temperature between 750° C. and 900° C.

8. The method of claim 7, wherein:
   (a) said anneal is at approximately 850° C. for approximately fifteen minutes.

* * * * *